United States Patent [19]

Rapp et al.

[11] Patent Number: 5,656,541
[45] Date of Patent: Aug. 12, 1997

[54] LOW TEMPERATURE $P_2O_5$ OXIDE DIFFUSION SOURCE

[75] Inventors: James E. Rapp, Oregon, Ohio; Gary R. Pickrell, Blacksburg, Va.

[73] Assignee: Techneglas, Inc., Columbus, Ohio

[21] Appl. No.: 498,200

[22] Filed: Jul. 5, 1995

Related U.S. Application Data

[60] Continuation of Ser. No. 266,968, Jun. 27, 1994, abandoned, which is a division of Ser. No. 986,940, Dec. 8, 1992, Pat. No. 5,350,461.

[51] Int. Cl.⁶ ............................................. H01L 21/223
[52] U.S. Cl. ..................... 437/168; 252/150; 423/263; 438/567
[58] Field of Search ............................ 437/160, 164, 437/168; 252/950, 951; 423/263

[56] References Cited

U.S. PATENT DOCUMENTS

| 4,033,790 | 7/1977 | Gunjigake | 437/160 |
| 4,195,226 | 3/1980 | Robbins | 250/363 R |
| 4,846,902 | 7/1989 | Pickrell | 437/168 |
| 4,891,331 | 1/1990 | Rapp | 437/164 |

OTHER PUBLICATIONS

Durrant, *Introduction to Advanced Inorganic Chemistry* John Wiley & Sons, NY (1970) pp. 1197–1202.

*Primary Examiner*—Trung Dang

[57] ABSTRACT

The present invention relates to a solid low temperature phosphorus diffusion source that is an $R_2O_3/P_2O_5$ compound in which the ratio of $R_2O_3$ to $P_2O_5$ is 1 to 5 and R is Nd, Eu, Pr, Sm, Ho, Tb, Er, Yb, Tm or Dy. The invention also relates to a method of making the diffusion source, a method of using the diffusion source to evolve $P_2O_5$ to dope a silicon wafer, and the doped silicon wafer.

5 Claims, No Drawings

LOW TEMPERATURE P$_2$O$_5$ OXIDE DIFFUSION SOURCE

This application is a continuation of application Ser. No. 08/266,968, filed Jun. 27, 1994 now abandoned which is a Division of application Ser. No 07/986,940 filed Dec. 8, 1992 and now U.S. Pat. No. 5,350,461.

The present invention relates to a solid low temperature phosphorus diffusion source that is an R$_2$O$_3$/P$_2$O$_5$ compound in which the ratio of R$_2$O$_3$ to P$_2$O$_5$ is 1 to 5 and R is Nd, Eu, Pr, Sm, Ho, Tb, Er, Yb, Tm or Dy. The invention also relates to a method of making the diffusion source, a method of using the diffusion source to evolve P$_2$O$_5$ to dope a silicon wafer, and the doped silicon wafer.

BACKGROUND OF THE INVENTION

A solid diffusion source comprising glass ceramic or polycrystalline particles is disclosed in the Rapp U.S. Pat. No. 4,141,738. In U.S. Pat. No. 4,033,790 there is disclosed solid diffusion sources made by hot pressing R$_2$O$_3$/P$_2$O$_5$ (La$_2$O$_3$/P$_2$O$_5$, Ce$_2$O$_3$/P$_2$O$_5$ and Y$_2$O$_3$/P$_2$O$_5$) compounds in which the R$_2$O$_3$ to P$_2$O$_5$ is mainly 1 to 5. The above U.S. Patents are incorporated by reference.

U.S. Pat. No. 4,846,902 discloses a solid diffusion source that is a Gd oxide/P$_2$O$_5$ compound in which the ratio of Gd oxide to P$_2$O$_5$ to about 1/1 to 1/5.

It is desirable to provide a solid diffusion source that is easily and efficiently made, and a source that evolves P$_2$O$_5$ relatively rapidly at a relatively low temperature.

OBJECTS OF THE INVENTION

It is an object of the present invention to prepare a doping composition as a diffusion source, to provide a doped silicon wafer, the composition being a penta phosphate R$_2$O$_3$/P$_2$O$_5$ in which the ratio of R$_2$O$_3$ to P$_2$O$_5$ is 1 to 5 and R is Nd, Eu, Pr, Sm, Ho, Tb, Er, Yb, Tm or Dy.

It is an object of the present invention to provide a method of making a doped silicon wafer using a solid diffusion source, the method comprising the steps of:

A. heating R$_2$O$_3$ oxide and H$_3$PO$_4$ to provide a R$_2$O$_3$ oxide/P$_2$O$_5$ composition consisting essentially of a R$_2$O$_3$/P$_2$O$_5$ compound in which the ratio of R$_2$O$_3$ to P$_2$O$_5$ is 1 to 5 and R is Nd, Eu, Pr, Sm, Ho, Tb, Er, Tm, Yb or Dy.

B. firing the composition to evolve P$_2$O$_5$ to deposit a phosphorus containing coating on the silicon wafer at a relatively low temperature and at a relatively high rate to form a glassy layer on the silicon wafer.

These and other objects will be apparent from the specification that follows and the appended claims.

SUMMARY OF THE INVENTION

The present invention provides a composition for a solid diffusion source to deposit a phosphorus oxide coating on a silicon wafer, the composition consisting essentially of an R$_2$O$_3$/P$_2$O$_3$ compound in which the ratio of R$_2$O$_3$ to P$_2$O$_3$ is about 1 to 5, and R is Nd, Eu, Pr, Sm, Ho, Tb, Er, Yb, Tm or Dy.

The present invention also includes a method of using the doping source by firing it at about 750° or 800° C. up to about 950° or 975° C.; and the doped silicon wafer itself.

The present invention also provides a method of making and using the doping source at a temperature preferably at about 800° to 925° C.

The present invention also provides a doping composition in which the above described penta phosphate doping compound contains ZrO$_2$.

DETAILED DESCRIPTION OF THE INVENTION

In the present invention, R is Group IIIa element (according to the Periodic Chart of the Elements, Page 46 of the International Critisol Tables of Numerical Data, Physics, Chemistry and Technology, 1926, McGraw-Hill). The suitable group IIIa elements have atomic numbers from 59–70 but not 64.

In one aspect, the R element has an atomic number from 59–63 (Pr, Nd, Sm and Eu). Suitable R elements also have an atomic number from 65–70 (Tb, Dy, Ho, Er, Tm and Yb) and preferably 66–68 or from 57–63 but not 61.

Preferred R elements are Yb, Dy, Er and Sm—these compounds being colorless or white or near white. Suitable R elements are Pr, Nd, Tb and Eu.

The pentaphosphate compounds evolve P$_2$O$_5$ to provide a glassy layer of about 300 or 400 or 500 A° up to 1000–2500 A° generally at a temperature at about 750° to 975° C. and as high as 1025° C.

EXAMPLE 1

Various R$_2$O$_3$.5P$_2$O$_5$ sources were prepared using stoichiometric amounts of R$_2$O$_3$ and P$_2$O$_5$ (in the H$_3$PO$_4$ starting material) as described in the Pickrell U.S. Pat. No. 4,846,902 for R$_2$O$_3$.5P$_2$O$_5$ materials and in U.S. Pat. No. 4,033,790 for R$_2$O$_3$.5P$_2$O$_5$ materials.

In each case, the R$_2$O$_3$ and H$_3$PO$_4$ were mixed with a excess of H$_3$PO$_4$. The excess water is evaporated off, and the mixed product fired at 750° C. for 15 hours to provide the R$_2$O$_3$.5P$_2$O$_5$ product.

The fired material was pressed and sintered as in the 4,033,790 patent, the resultant billet being sliced into individual diffusion source wafers.

In a typical formulation, the following was mixed in approximate grams to provide approximately the following mixture:

| Ingredients | Grams |
| --- | --- |
| Nd$_2$O$_3$ (1 mole per 5 moles P$_2$O$_5$) | 112 |
| H$_3$PO$_4$ (85%) | 384 |

The procedure followed is set forth in the aforementioned Pickrell U.S. Pat. No. 4,846,902, the water of the R$_2$O$_3$/P$_2$O$_5$ mixture being driven off the mixture by heating at 150° C. Thereafter, the crucible was covered and fired at 750° C. for 15 hours to provide the neodymium oxide/5P$_2$O$_5$ product. The resultant crystalline product was ball-milled to obtain a fine powder (−60 mesh).

Silicon wafers and the diffusion source were heated to 900° C. and the pentaphosphate source fired at 900° C. for 1 hour to evolve P$_2$O$_3$ and coat the heated wafers with a glassy film of about 1000 A° in thickness. This is a sufficient amount of glass to satisfactorily dope the wafer at 900° C. The sheet resistively of the doped wafer was satisfactory. Excellent film thickness also was obtained by firing for 1 hour at 825° to 975° C.

Other doping source R$_2$O$_3$.5P$_2$O$_5$ compounds were prepared and fired for 1 hour to evolve P$_2$O$_5$ at the temperature indicated in the table below to coat silicon wafers with a glassy film of about 300–2000 A°.

| $R_2O_3 \cdot 5P_2O_5$ Compound | Firing Temperature° C. |
|---|---|
| $Pr_2O_3 \cdot 5P_2O_5$ | 850–950 |
| $Nd_2O_3 \cdot 5P_2O_5$ | 825–950 |
| $Sm_2O_3 \cdot 5P_2O_5$ | 850–950 |
| $Dy_2O_3 \cdot 5P_2O_5$ | 850–975 |
| $Er_2O_3 \cdot 5P_2O_5$ | 850–1025 |
| $Er_2O_3 \cdot ZrO_2 \cdot 5P_2O_5$ | 800–975 |

$Er_2O_3.5P_2O_5$ evolves $P_2O_5$ at a good rate over a wide temperature rnage, glassy films of 200 A° or more deposited at 800° to 1025° C.

As in the case of $Er_2O_3.ZRO_2.5P_2O_5$, substantially similar results can be obtained by the use of $ZrO_2$ in the other rare earth oxide/.$5P_2O_5$ compounds.

In the $R_2O_3.5P_2O_5$ compounds, R is a Group IIIa rare earth element (International Critical Tables) having an atomic number as follows:

| R | Atomic Number |
|---|---|
| Pr | 59 |
| Nd | 60 |
| Sm | 62 |
| Eu | 63 |
| Tb | 65 |
| Dy | 66 |
| Ho | 67 |
| Er | 68 |
| Tm (or Tu) | 69 |
| Yb | 70 |

The above examples illustrate the $R_2O_3.5P_2O_5$ diffusion sources, the methods of making the diffusion sources, the methods of using the sources by firing the same to evolve $P_2O_5$, and methods of making the doped silicon wafers that are useful in a typical emitter diffusion, in channel MOS diffusion and in the doping of a polysilicon layer without undesirable toxic gases and liquids.

What is claimed is:

1. A method of making a solid diffusion source and firing the source to provide a doped silicon wafer, the method comprising the steps of:
   A. heating a $R_2O_3$ oxide and $H_3PO_4$ to provide a $R_2O_3$ oxide/$P_2O_5$ compound in which the ratio of $R_2O_3$ to $P_2O_5$ is 1:5 and R is Nd, Eu, Pr, Sm, Ho, Tb, Er, Tm, Yb, or Dy.
   B. firing the composition to evolve $P_2O_5$ to deposit a phosphorus containing coating on the silicon wafer at about 750° C. to 1025° C. to form a glassy layer having a thickness of about 300° A to about 2500° A on the silicon wafer.

2. A process of making a doped source wafer from a doping source by a $R_2O_3$ oxide/$P_2O_5$ composition consisting essentially of an $R_2O_3/P_2O_5$ compound in which the ratio of $R_2O_3$ to $P_2O_5$ is 1:5 and R is Nd, Eu, Pr, Sm, Ho, Tb, Er, Tm, Yb or Dy, the process comprising firing the doping source at about 75020 C. to 975° C. to form a glassy layer of about 500 A° to 2000 A° on the wafer.

3. A method of using a doping source to provide a doped silicon wafer, the doping source consisting essentially of a $R_2O_3/P_2O_5$ compound in which the ratio of $R_2O_3$ to $P_2O_5$ is about 1:5, and R is Nd, Eu, Pr, Sm, Ho, Tb, Er, Yb, Tm, or Dy, the method comprising firing the doping source at about 750° C. to 975° C. to evolve $P_2O_5$ to deposit a phosphorus containing coating having a thickness of about 300 A° to 2000 A° on a silicon wafer to form a glass layer on the silicon wafer.

4. A method of making a doped silicon wafer using a solid diffusion source, the method comprising the steps of:
   A. heating $R_2O_3$ oxide, $ZrO_2$ and $H_3PO_4$ to provide a $R_2O_3$ oxide/$P_2O_5$ composition consisting essentially of an $R_2O_3/ZrO_2/P_2O_5$ compound in which the ratio of $R_2O_3/P_2O_5$ is 1 to 5 and R is Nd, Eu, Pr, Sm, Ho, Tb, Er, Tm, Yb or Dy, the $ZrO_2$ being in the crystalline structure;
   B. firing the composition to evolve $P_2O_5$ to deposit a phosphorus containing coating on the silicon wafer to form a glassy layer on the silicon wafer.

5. A method as defined in claim 4 in which R is Sm.

* * * * *